(12) United States Patent
Teo et al.

(10) Patent No.: US 7,532,147 B2
(45) Date of Patent: May 12, 2009

(54) ANALOG VOLTAGE LATCH

(75) Inventors: Kian Teck Teo, Singapore (SG); Tien Yew Kang, Singapore (SG)

(73) Assignees: Panasonic Corporation, Osaka (JP); Panasonic Semiconductor Asia Pte. Ltd., Singapore (SG)

( * ) Notice: Subject to any disclaimer, the term of this patent is extended or adjusted under 35 U.S.C. 154(b) by 0 days.

(21) Appl. No.: 12/018,233

(22) Filed: Jan. 23, 2008

(65) Prior Publication Data

US 2008/0174341 A1 Jul. 24, 2008

Related U.S. Application Data

(60) Provisional application No. 60/886,364, filed on Jan. 24, 2007.

(51) Int. Cl.
*H03M 1/34* (2006.01)
(52) U.S. Cl. .................. 341/164; 341/159; 341/161; 341/162
(58) Field of Classification Search ............ 341/164, 341/159
See application file for complete search history.

(56) References Cited

U.S. PATENT DOCUMENTS

| 6,157,338 | A | 12/2000 | Gross, Jr. | |
| 6,404,372 | B1 * | 6/2002 | Heithoff | 341/155 |
| 7,071,862 | B1 | 7/2006 | Scarpulla | |
| 7,405,688 | B2 * | 7/2008 | Prestros | 341/155 |

* cited by examiner

*Primary Examiner*—Khai M Nguyen
(74) *Attorney, Agent, or Firm*—Greenblum & Bernstein, P.L.C.

(57) ABSTRACT

An analog voltage latch for use in a controller for controlling a motor equipped electric bicycle, includes a window comparator for comparing an analog voltage latch output and an analog input voltage to produce a comparison result, an S-R latch for producing HIGH or LOW according to the comparison result, a selector for selecting an operation, an up/down counter for counting up or down according to the HIGH or LOW from the S-R latch, and holding the counted result according to the selector result, and a DA converter for converting the counted result to analog signal.

4 Claims, 2 Drawing Sheets

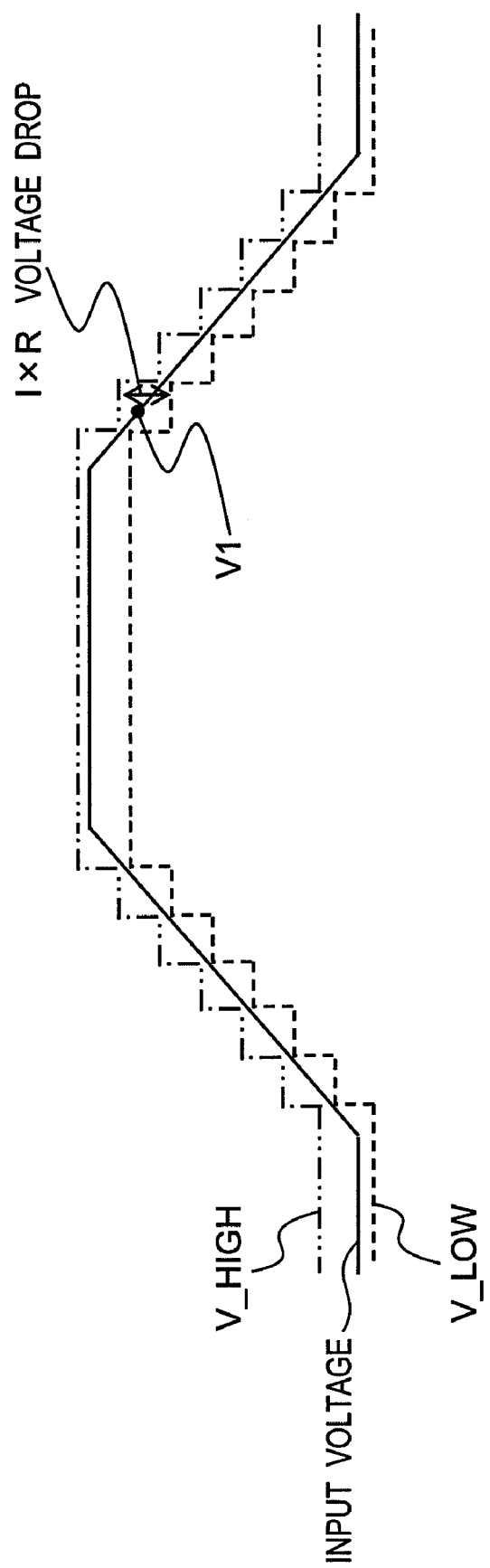

ANALOG VOLTAGE LATCH

CROSS-REFERENCE TO RELATED APPLICATIONS

This application claims the benefit of U.S. Provisional Application No. 60/886,364, filed Jan. 24, 2007.

BACKGROUND OF THE INVENTION

The present invention relates to an analog voltage latch, and more particularly, to an analog voltage latch capable of tracking and latching an analog input voltage.

Conventional method of implementing an analog voltage latching circuit involves using an analog-to-digital converter (ADC) that converts the analog input voltage into a digital code. This digital code is then converted back to analog voltage via a digital-to-analog converter (DAC). The latching of the analog input voltage signal is achieved by locking the digital code upon activation of a latch signal. However, this conventional implementation requires an ADC which takes up huge area in the silicon chip.

SUMMARY OF THE INVENTION

An object of this invention is to implement an analog voltage latch with an up/down counter and window comparator, such that analog-to-digital converter (ADC) is not required. Therefore, the effort to develop an ADC is saved and valuable silicon area cost is reduced.

According to the present invention, said analog voltage latch comprises: a window comparator operable to compare the analog voltage latch output ("latch output" hereinafter) and the analog input voltage and to produce comparison results; an S-R latch operable to determine the relation between the latch output and the analog input voltage according to the window comparator result; a latching select block operable to activate or deactivate the latching of the analog input voltage; an up/down counter operable to increase or decrease number of counts based on the S-R latch result and a clock signal; a digital-to-analog converter operable to convert the digital count to an analog voltage as the latch output; an operational amplifier-based source follower operable to buffer the latch output for comparison action in the window comparator; a resistor and a current source operable to provide a voltage drop required by the window comparator.

The main advantage of the present invention is the utilization of a window comparator and up/down counter, instead of a full-fledged ADC.

BRIEF DESCRIPTION OF THE DRAWINGS

FIG. 2 is a diagram showing the relation among analog input voltage, V_HIGH and V_LOW voltages.

DETAILED DESCRIPTION OF THE PREFERRED EMBODIMENT

Figure 1:
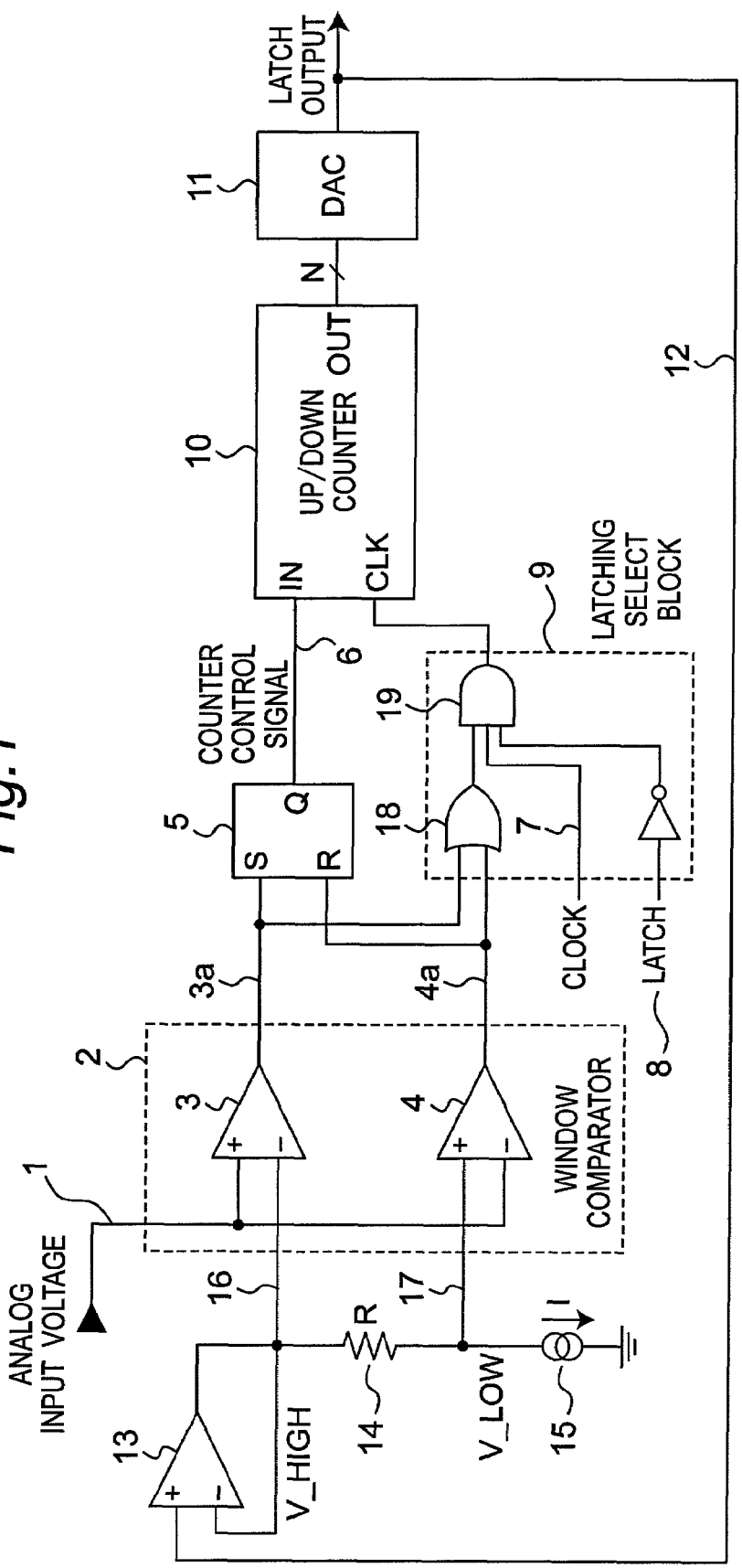
FIG. 1 is a block diagram showing an analog voltage latch, according to the present invention.

An analog voltage latch according to the present invention is to track and latch an analog voltage with the use of an up/down counter and a window comparator.

Referring to FIG. 1, the analog voltage latch has an operational amplifier-based source follower 13. The non-inverting input of the source follower 13 is the latch output 12; hence, its output V_HIGH 16 closely tracks this analog latch output 12. The analog voltage latch further has the following items. A resistor 14 and a current source 15 that function to define the upper and lower voltage limits, V_HIGH 16 and V_LOW 17 respectively, for a window comparator 2. A window comparator 2 for checking if the analog input voltage 1 falls within the window comparator's upper and lower limits. An S-R latch 5 for producing a counter control signal 6 based on the outputs 3a and 4a from window comparator 2. A latching select block 9 is provided for activating latching of the analog input voltage. An up/down counter 10, in response to a clock event, counts up when the counter control signal 6 thereto is HIGH, and counts down when the counter control signal 6 thereto is LOW. A DAC (digital-to-analog converter) 11 converts the digital counter output into an analog format, thereby producing the latch output 12.

Next, the track operation of the analog voltage latch is described.

The latch output 12 is buffered by or fedback to the operational amplifier-based source follower 13. The latch output 12 appears at the source follower 13 output as V_HIGH 16. With a resistor R 14 and a current source I 15, a voltage drop of (I×R) is developed across two nodes, V_HIGH 16 and V_LOW 17. The window comparator 2 has two sub-comparators 3 and 4. The signal V_HIGH 16 is fed to the negative input of sub-comparator 3, while the signal V_LOW 17 is fed to the positive input of sub-comparator 4. An analog input voltage 1, which the analog voltage latch tracks, is fed to the positive input of sub-comparator 3 and the negative input of sub-comparator 4.

When the analog input voltage 1 is higher than the latch output 12, which means that the latch output 12 needs to increase to track the analog input voltage 1, the outputs 3a and 4a of sub-comparators 3 and 4 will be HIGH and LOW, respectively. The S-R latch 5 thus performs a SET action. Since the circuit is in tracking mode, the up/down counter 10 increases its count in response to a clock event. A DAC 11 translates this digital count information into an analog format, latch output 12. The up/down counter 10 continues to increase until the analog voltage latch tracks, i.e., becomes nearly equal to the analog input voltage 1.

In another case, when the analog input voltage 1 is lower than V_LOW 17, which means that the latch output 12 needs to decrease to track the analog input voltage 1, the outputs 3a and 4a will be LOW and HIGH, respectively. The S-R latch 5 therefore takes a RESET action, resulting in a lower count output from the up/down counter 10, and a lower level of latch output 12. The up/down counter 10 continues to decrease until the analog voltage latch tracks, i.e., becomes nearly equal to the analog input voltage 1.

In yet another case, when the analog input voltage 1 is lower than V_HIGH 16, but higher than V_LOW 17, this means that the input voltage V1 is "locked" or falls between V_HIGH 16 and V_LOW 17. Hence, in this case, latch output 12 tracks the analog input voltage 1. The outputs 3a and 4a will both be LOW. The S-R latch 5 thus holds the previous output. Since outputs 3a and 4a are LOW, the output of OR gate 18 (within latching select block 9), will be LOW, thus causing the output of AND gate 19 to be fixed to LOW. As a result, no clock event will be triggered to the CLK input of up/down counter 10 and it remains at its previous output.

In the following, the latch operation of this analog voltage latch is described.

Once the analog input voltage 1 is tracked by the latch output 12, the analog voltage latch is able to latch this analog input voltage 1 with assertion of a latch signal 8 to the latching select block 9. The latching select block 9 thereafter functions to block the clock input to the up/down counter 10, and hence up/down counter 10 remains at its previous output as no clock event is triggering. The previous analog input voltage 1 is therefore latched by this analog voltage latch.

With the removal of this latch signal 8, the analog voltage latch is reverted back to its track operation from the latch operation.

According to the present invention, since there is no analog-to-digital converter used in the voltage latch circuit, the voltage latch circuit can be prepared in a small silicon chip.

The above-described disclosure of the invention in terms of the presently preferred embodiments is not to be interpreted as intended for limiting. Various alterations and modifications will no doubt become apparent to those skilled in the art to which the invention pertains, after having read the disclosure. As a corollary to that, such alterations and modifications apparently fall within the true spirit and scope of the invention. Furthermore, it is to be understood that the appended claims be intended as covering the alterations and modifications.

What is claimed is:

1. An analog voltage latch comprising:
    a window comparator operable to compare an analog voltage latch output and an analog input voltage to produce a comparison result;
    an S-R latch operable to determine the relation between the analog voltage latch output and the analog input voltage according to the comparison result and to produce an S-R latch result;
    a latching select block operable to activate or deactivate the latching of the analog input voltage;
    an up/down counter operable to increase or decrease number of counts based on the S-R latch result and a clock signal and to produce a digital counter output;
    a digital-to-analog converter operable to convert the digital counter output to an analog voltage as the analog voltage latch output;
    an operational amplifier-based source follower operable to buffer the analog voltage latch output for comparison action in the window comparator; and
    a pair of a resistor and a current source operable to provide a voltage drop required by the window comparator.

2. A method for latching an analog voltage by the analog voltage latch according to claim 1 to track the analog input voltage, the method comprising:
    inputting an analog voltage to the analog voltage latch;
    comparing the analog input voltage with an analog voltage latch output by said window comparator, and producing comparator results of (HIGH, LOW), (LOW, HIGH) and (LOW, LOW) which represent the analog voltage latch output is lower than, higher than, and substantially the same as the analog input voltage, respectively;
    updating the up/down counter output count according to the comparison result, and producing an analog voltage latch output proportional to the counter output with a digital-to-analog converter; and
    buffering the analog voltage latch output by a source follower, and creating a voltage drop from the analog voltage latch output for use by the window comparator.

3. A method for latching an analog voltage by the analog voltage latch according to claim 1 to latch the analog input voltage, the method comprising:
    updating the up/down counter for the analog voltage latch to track the analog input voltage;
    latching the analog input voltage by asserting a latch signal, and stop clock signal from going into the up/down counter.

4. The analog voltage latch according to claim 1, wherein the up/down counter is able to track and latch an analog input voltage.

* * * * *